(12) United States Patent
Nagel et al.

(10) Patent No.: US 11,860,184 B2
(45) Date of Patent: Jan. 2, 2024

(54) MICROMECHANICAL STRUCTURE AND MICROMECHANICAL SENSOR

(71) Applicant: Robert Bosch GmbH, Stuttgart (DE)

(72) Inventors: Cristian Nagel, Reutlingen (DE); Johannes Classen, Reutlingen (DE); Lars Tebje, Reutlingen (DE); Rolf Scheben, Reutlingen (DE); Rudy Eid, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/447,876

(22) Filed: Sep. 16, 2021

(65) Prior Publication Data
US 2022/0091154 A1 Mar. 24, 2022

(30) Foreign Application Priority Data
Sep. 23, 2020 (DE) .......................... 102020211922.8

(51) Int. Cl.
*G01P 15/08* (2006.01)
*G01P 15/125* (2006.01)
*B81B 3/00* (2006.01)

(52) U.S. Cl.
CPC .......... *G01P 15/0802* (2013.01); *B81B 3/001* (2013.01); *B81B 3/0051* (2013.01); *G01P 15/125* (2013.01); *B81B 2201/0235* (2013.01); *B81B 2203/0163* (2013.01); *B81B 2203/04* (2013.01); *G01P 2015/0831* (2013.01);
(Continued)

(58) Field of Classification Search
CPC .... G01P 15/125; G01P 15/0802; G01P 15/08; G01P 2015/0831; G01P 2015/0871; G01P 2015/0862; B81B 3/001; B81B 3/0016; B81B 3/0018; B81B 3/0051
See application file for complete search history.

(56) References Cited

U.S. PATENT DOCUMENTS

2012/0280591 A1* 11/2012 Schultz ................. B81B 3/0016
310/300
2013/0299923 A1* 11/2013 Classen ................. B81B 3/0051
257/415
(Continued)

FOREIGN PATENT DOCUMENTS

DE 102008043753 A1 5/2010
DE 102012207939 A1 11/2013
(Continued)

*Primary Examiner* — Helen C Kwok
(74) *Attorney, Agent, or Firm* — NORTON ROSE FULBRIGHT US LLP; Gerard A. Messina

(57) ABSTRACT

A micromechanical structure including a substrate, a moveable seismic mass, a detection structure, and a main spring. The seismic mass is connected to the substrate using the main spring. A first direction and a second direction perpendicular thereto define a main extension plane of the substrate. The detection structure detects a deflection of the seismic mass and includes first electrodes mounted at the seismic mass and second electrodes mounted at the substrate. The first electrodes and second electrodes have a two-dimensional extension in the first and second directions. The micromechanical structure has a graduated stop structure including a first spring stop, a second spring stop, and a fixed stop.

8 Claims, 6 Drawing Sheets

(52) U.S. Cl.
CPC ........... *G01P 2015/0862* (2013.01); *G01P 2015/0871* (2013.01)

(56) References Cited

U.S. PATENT DOCUMENTS

| | | | | |
|---|---|---|---|---|
| 2015/0241216 A1* | 8/2015 | Ahtee | ............... | G01C 19/5712 |
| | | | | 73/504.12 |
| 2018/0045515 A1* | 2/2018 | Simoni | ............... | B81B 3/0078 |
| 2019/0120872 A1* | 4/2019 | Geisberger | ............ | G01P 15/125 |

FOREIGN PATENT DOCUMENTS

| | | |
|---|---|---|
| DE | 102016214962 A1 | 2/2018 |
| EP | 3111232 A1 | 1/2017 |
| EP | 3121605 A1 | 1/2017 |
| KR | 20160059766 A | 5/2016 |
| WO | 2015128819 A1 | 9/2015 |

\* cited by examiner

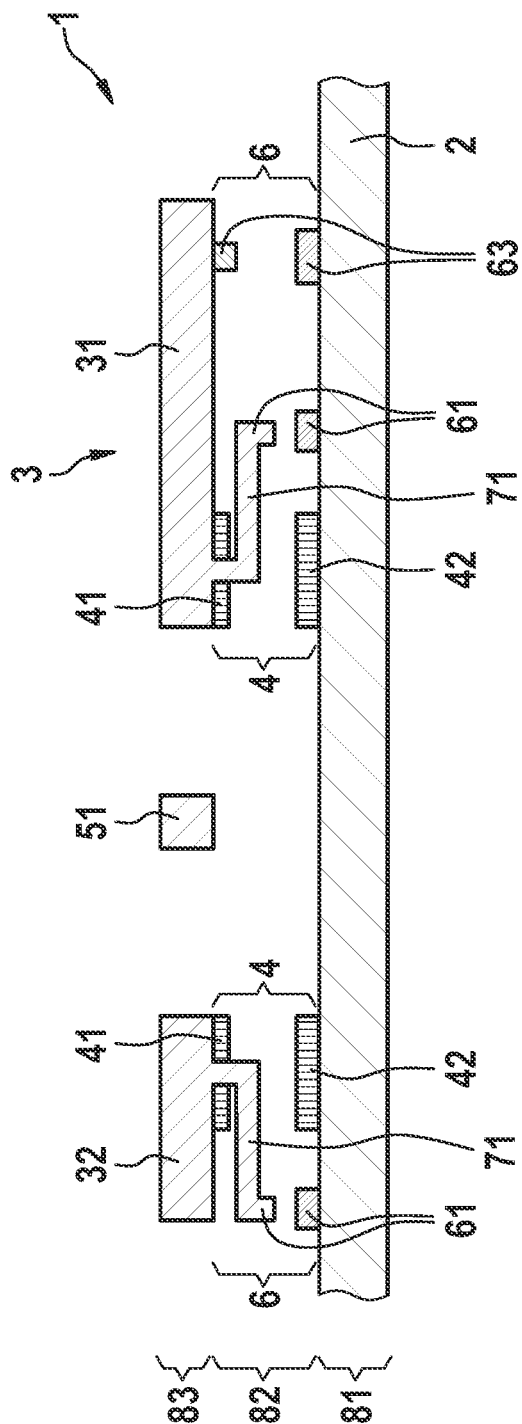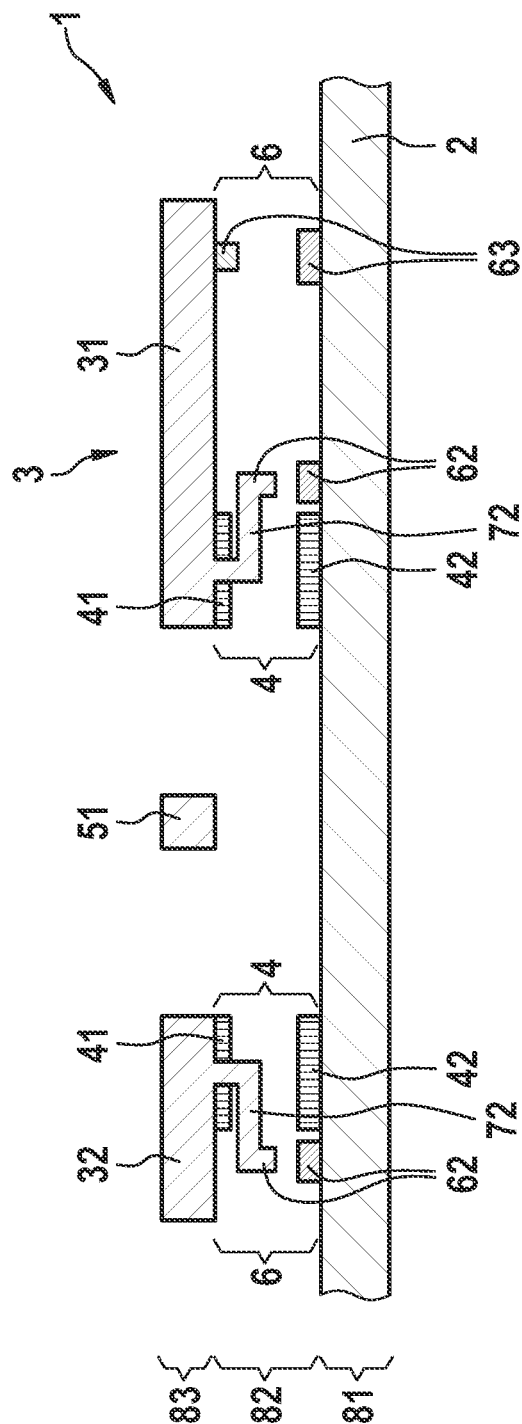

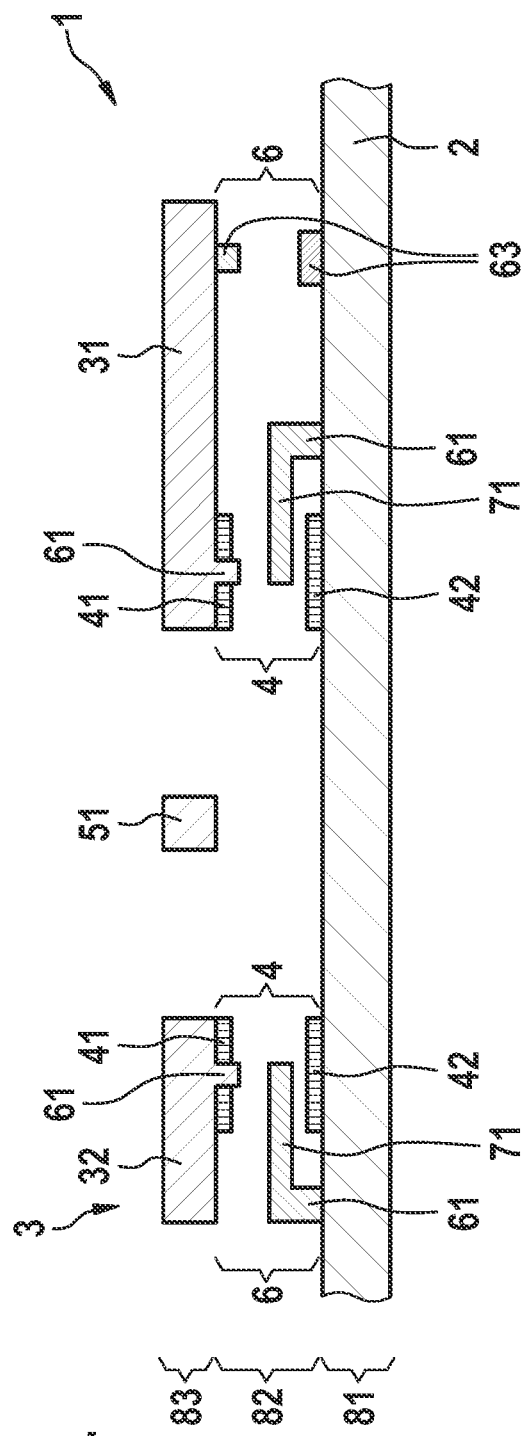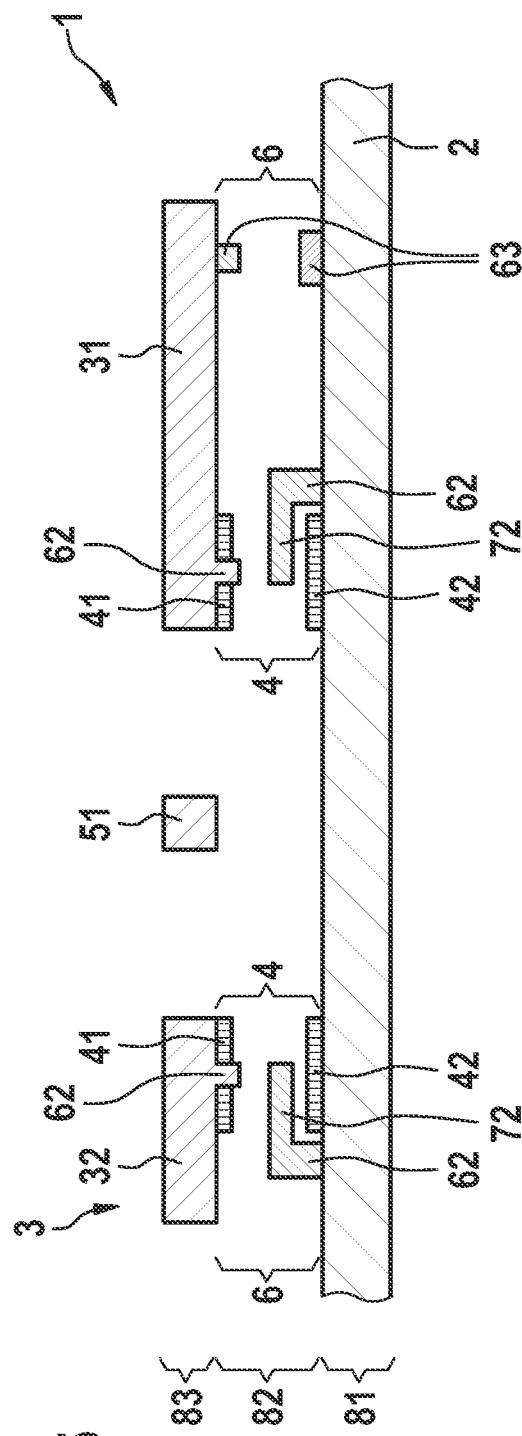

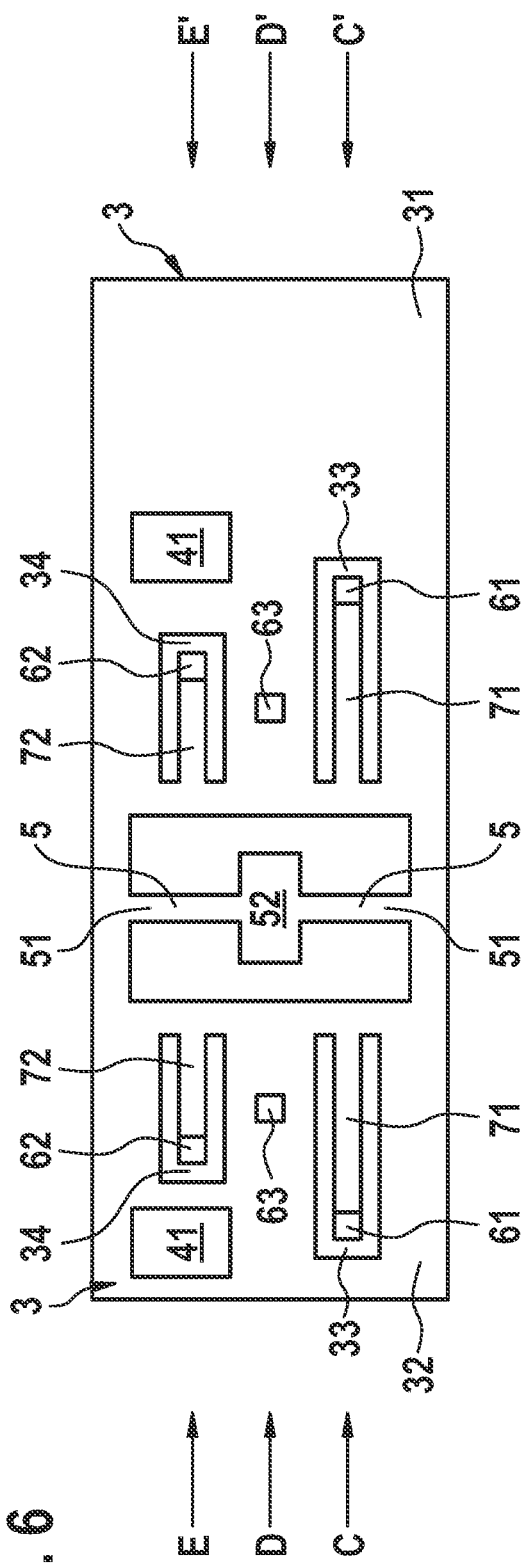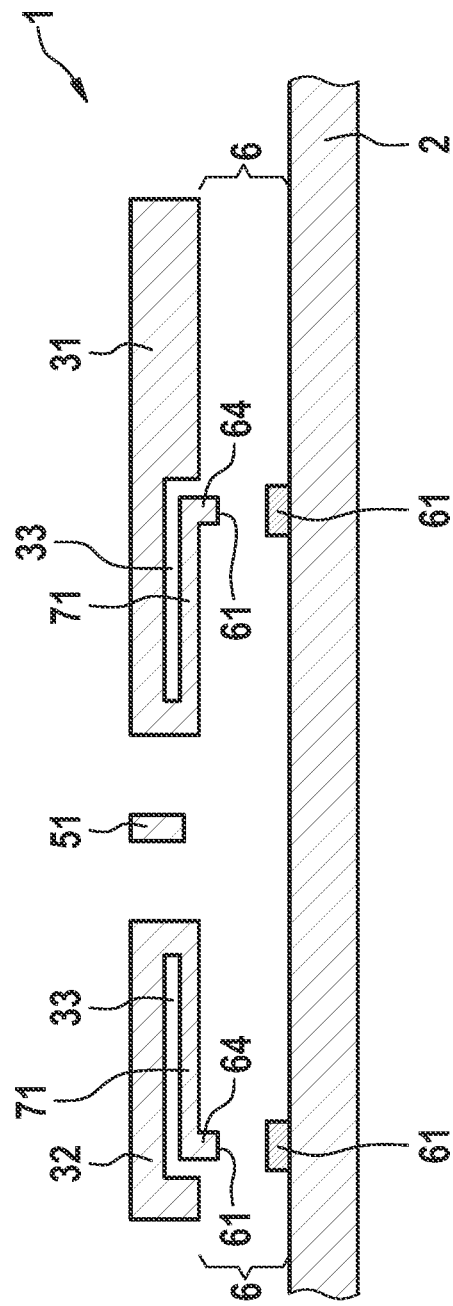

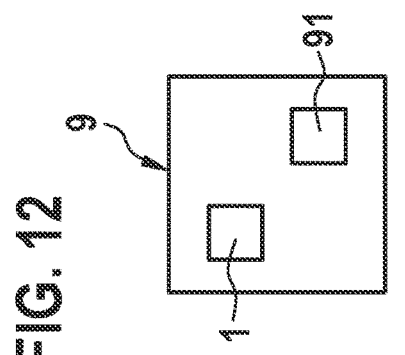
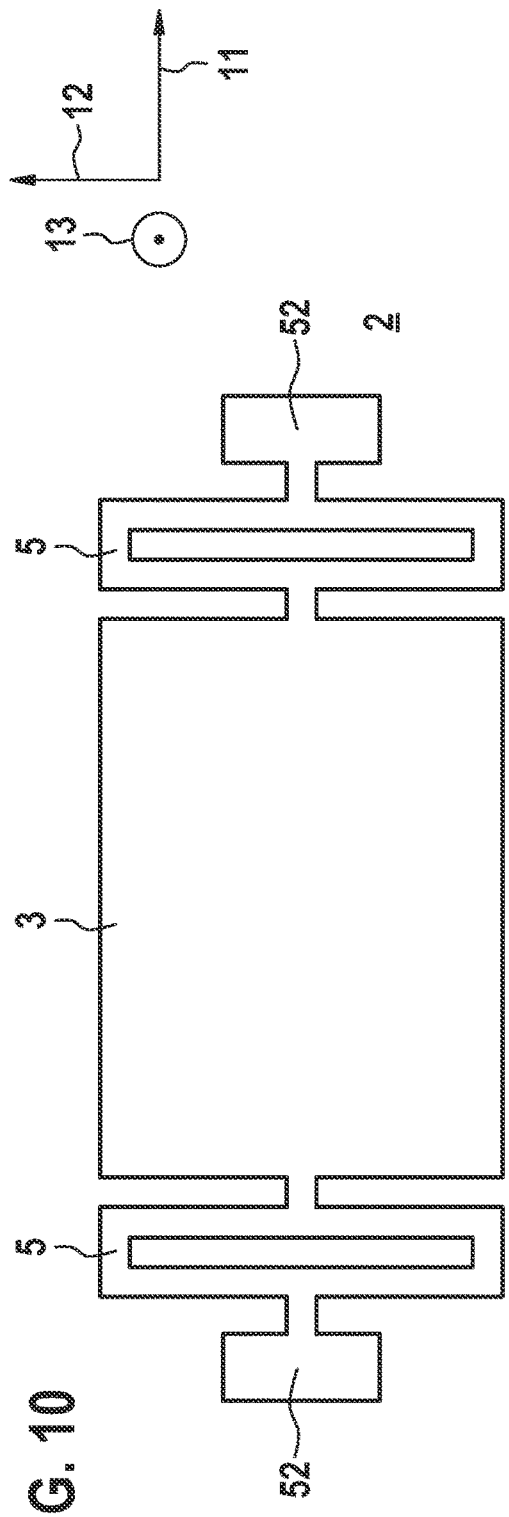
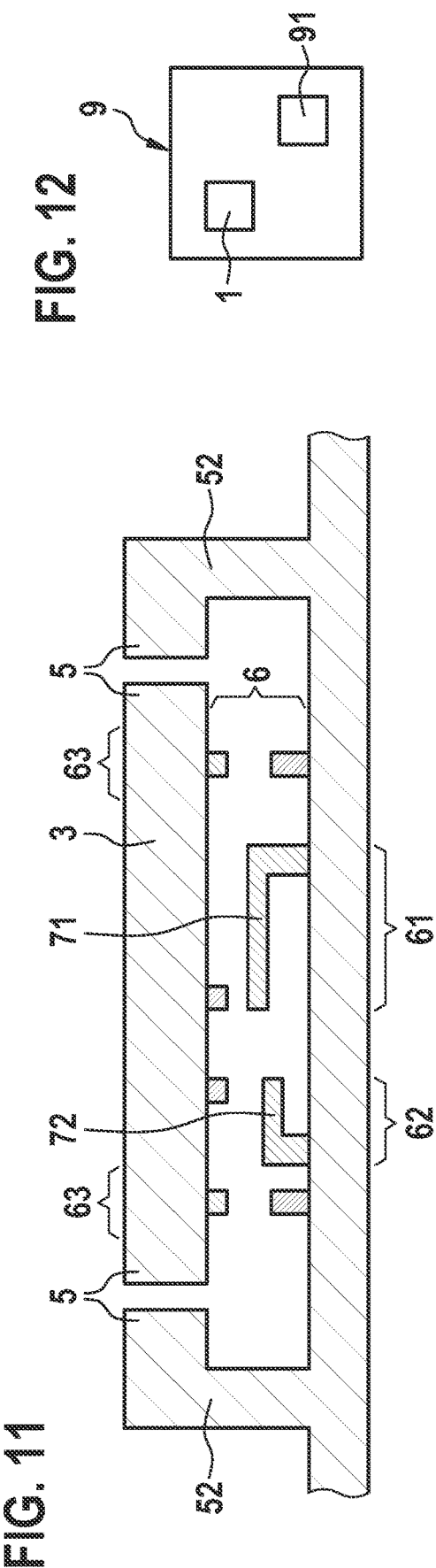

MICROMECHANICAL STRUCTURE AND MICROMECHANICAL SENSOR

CROSS REFERENCE

The present application claims the benefit under 35 U.S.C. § 119 of German Patent Application No. DE 102020211922.8 filed on Sep. 23, 2020, which is expressly incorporated herein by reference in its entirety.

FIELD

The present invention relates to a micromechanical structure and a micromechanical sensor.

BACKGROUND INFORMATION

Micromechanical inertial sensors for measuring acceleration and rotation rate are manufactured in mass production for various applications in the automotive and consumer sectors. "Rockers" are preferably utilized for capacitive acceleration sensors having a detection direction perpendicular to the wafer plane (z-direction). The sensor principle of these rockers is based on a spring-mass system, in which, in the simplest case, a movable seismic mass including two counter-electrodes fixed on the substrate form two plate capacitors. The seismic mass is connected to a substrate via at least one, for reasons of symmetry usually rather two, torsion spring(s). If the mass structures on the two sides of the torsion spring are of different sizes, the mass structure will rotate in relation to the torsion spring as the rotation axis when acted upon by a z-acceleration. Therefore, the distance between the electrodes decreases on the side having the greater mass and increases on the other side. The change in capacitance is a measure for the acting acceleration.

One possible error pattern in frequently repeated shock loads is the adhesive bonding, in which the movable sensor mass remains stuck at a mechanical fixed stop as soon as the adhesive forces in the stop are greater than the restoring forces of the spring-mass system. In order to reduce the adhesive forces, a so-called anti-stiction coating (ASC) is often utilized, which is situated on the surface of the sensor after the sensor has been exposed. If a sensor impacts a fixed stop very often, however, the ASC may become damaged, so that the sensor finally exhibits an increased adhesion tendency. One further possible error pattern due to very frequent mechanical impacting is the formation of particles, which result from very fine wear debris at the surfaces of the stops. Such particles may possibly accumulate and result in a limitation of the freedom of movement, in electrical short circuits, or also, once again, in adhesive bonding.

Various elastic stops were provided in the past, which, on the one hand, cushion the impact at the stop, i.e., reduce the mechanical damage of the stop surfaces, and, on the other hand, offer an increased restoring force in the case of heavy overload, since, in addition to the restoring force of the functional springs of the sensor, the stop spring also contributes to the restoring force. A few documents are mentioned as the related art for elastic stops. German Patent Application No. DE 10 2008 043 753 A1 describes a sensor including an elastic stop, which is implemented in the same functional plane as the seismic mass. European Patent No. EP 3 111 232 B1 describes a highly similar system, although, in this case, the stop may act not only in one direction, but rather on both sides (i.e., in the direction of the bottom electrodes as well as in the direction of the sensor cap) (FIG. 5). German Patent Application No. DE 10 2012 207 939 A1 describes an elastic stop, which is formed from a second thin functional layer underneath or above a thicker functional layer. In this case, the stop may take place in the direction of the bottom electrodes when the thin functional layer is situated underneath the thick functional layer. If the thin layer is situated above the thick functional layer, the stop may take place in the direction of the sensor cap, however.

Further examples of such spring stops are described in the documents German Patent Application No. DE 10 2016 214 962 A1, U.S. Patent Application Publication No. US 2019/0120872 A1, and Korea Patent Application No. KR 2016 0 059 766 A1.

SUMMARY

One object of the present invention is to enable a micromechanical structure having a further improvement with respect to an overload stability and, in particular, to minimize the adhesion risk. One further object of the present invention is to provide a micromechanical sensor including a micromechanical structure of this type.

These objects may be achieved with the aid of example embodiments of the present invention. Advantageous refinements are described herein.

A micromechanical structure includes a substrate and a seismic mass, which is movable with respect to the substrate, and, furthermore, detection means (detection structure) and a main spring. The seismic mass is connected to the substrate with the aid of the main spring. A first direction and a second direction essentially perpendicular to the first direction define a main extension plane of the substrate, the main extension plane being designated as the x-y-plane. The detection means are provided for detecting a deflection of the seismic mass and include an electrode structure including first electrodes mounted at the seismic mass and including second electrodes mounted at the substrate. The first electrodes and second electrodes have an essentially two-dimensional extension in the first direction and in the second direction. Moreover, the micromechanical structure has a graduated stop structure including a first spring stop, a second spring stop, and a fixed stop. The stop structure is designed in such a way that, initially, the first spring stop comes into mechanical contact during a movement of at least one portion of the seismic mass in a third direction, which is perpendicular to the first direction and to the second direction, beyond an operating range; thereafter, the second spring stop comes into mechanical contact during a further movement of at least one portion of the seismic mass in the third direction; and thereafter, the fixed stop comes into mechanical contact during a further movement of at least one portion of the seismic mass in the third direction. The third direction may also be designated as the z-direction.

In one specific embodiment of the present invention, the micromechanical structure includes multiple functional layers, the first spring stop and the second spring stop being at least partially situated in the same functional layer.

In one specific embodiment of the present invention, the first spring stop includes a first stop spring and the second spring stop includes a second stop spring. A first spring stiffness of the first stop spring is lesser than a second spring stiffness of the second stop spring. The first spring stiffness is greater than a third spring stiffness of the main spring. As a result, particularly advantageous restoring forces result upon impact of the first spring stop and of the second spring stop.

In one specific embodiment of the present invention, the first spring stop and the second spring stop are at least partially situated within the seismic mass. This enables a simple configuration of the micromechanical structure.

In one specific embodiment of the present invention, the first spring stop, the second spring stop, and the fixed stop are situated between the substrate and the seismic mass. This also enables a simple configuration of the micromechanical structure.

In one specific embodiment of the present invention, the main spring includes a torsion spring, the detection means being provided for detecting a rotatory deflection of the seismic mass about a rotation axis, the rotation axis being situated in the second direction.

In one specific embodiment of the present invention, the fixed stop has a greater distance to the torsion spring than the first spring stop with respect to the first direction. Moreover, the first spring stop has a greater distance to the torsion spring than the second spring stop with respect to the first direction. This yields a simple configuration of the micromechanical structure.

In one specific embodiment of the present invention, the seismic mass may be completely deflected in the third direction during an acceleration acting in the third direction. The detection means are provided for detecting the deflection in the third direction.

In one specific embodiment of the present invention, the fixed stop has a greater base distance than the second spring stop with respect to the third direction and the second spring stop has a greater base distance than the first spring stop with respect to the third direction.

In accordance with an example embodiment of the present invention, a micromechanical sensor contains a micromechanical structure according to the present invention and may additionally contain a control chip for evaluating the detection means.

Exemplary embodiments of the present invention are explained below with reference to the figures.

BRIEF DESCRIPTION OF THE DRAWINGS

FIG. 2 shows a cross section of the micromechanical structure from FIG. 1.

FIG. 3 shows a further cross section of the micromechanical structure from FIG. 1.

FIG. 4 shows a cross section of a further micromechanical structure, in accordance with an example embodiment of the present invention.

FIG. 5 shows a further cross section of the micromechanical structure from FIG. 4.

FIG. 6 shows a view of a seismic mass of a further micromechanical structure, in accordance with an example embodiment of the present invention.

FIG. 7 shows a cross section of the micromechanical structure from FIG. 6.

FIG. 10 shows a top view of a further micromechanical structure, in accordance with an example embodiment of the present invention.

FIG. 11 shows a cross section of the micromechanical structure from FIG. 10.

FIG. 12 shows a micromechanical sensor, in accordance with an example embodiment of the present invention.

DETAILED DESCRIPTION OF EXAMPLE EMBODIMENTS

Figure 1:
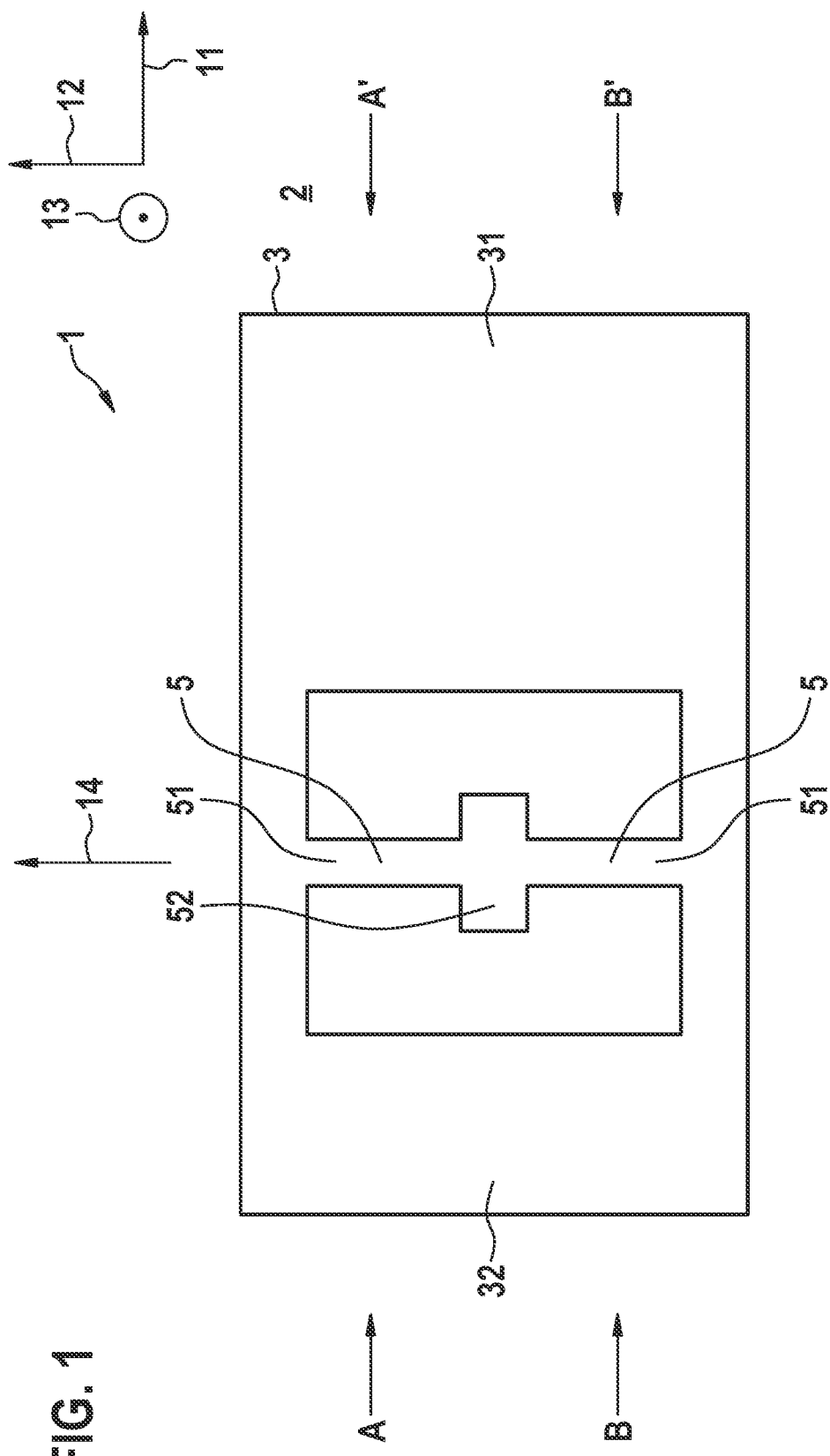
FIG. 1 shows a top view of a micromechanical structure, in accordance with an example embodiment of the present invention.

FIG. 1 shows a top view of a micromechanical structure 1, including a substrate 2 and a seismic mass 3 movable with respect to substrate 2. Seismic mass 3 is connected with the aid of two main springs 5 to substrate 2 via an anchoring element 52, main springs 5 being designed as torsion springs. A first direction 11 and a second direction 12 essentially perpendicular to first direction 11 define a main extension plane of substrate 2. A third direction 13 is perpendicular to the main extension plane. Seismic mass 3 includes a first sub-mass 31 and a second sub-mass 32, the sub-masses 31, 32 being situated on different sides of torsion spring 51. During an acceleration of seismic mass 3 in third direction 13, one of the sub-masses 31, 32 moves toward substrate 2 and the other of the sub-masses 32, 31 moves away from substrate 2. First sub-mass 31 moves toward substrate 2 and second sub-mass 32 moves away from substrate 2 when micromechanical structure 1 is accelerated in third direction 13. First sub-mass 31 moves away from substrate 2 and second sub-mass 32 moves toward substrate 2 when micromechanical structure 1 is accelerated opposite to third direction 13.

FIG. 2 shows a cross section of micromechanical structure 1 from FIG. 1 at the section line designated as AA' in FIG. 1. Detection means 4 are provided for detecting a deflection of seismic mass 3, detection means 4 including an electrode structure including first electrodes 41 mounted at seismic mass 3 and including second electrodes 42 mounted at substrate 2. First electrodes 41 and second electrodes 42 have an essentially two-dimensional extension in first direction 11 and in second direction 12.

FIG. 3 shows a cross section of micromechanical structure 1 from FIG. 1 at the section line designated as BB' in FIG. 1.

Moreover, micromechanical structure 2 has a graduated stop structure 6 including a first spring stop 61, a second spring stop 62, and a fixed stop 63. First spring stop 61 and fixed stop 63 are apparent in FIG. 2, while second spring stop 62 and fixed stop 63 are apparent in FIG. 3. First spring stop 61 and second spring stop 62 are situated one behind the other in second direction 12. Stop structure 6 is designed in such a way that, initially, first spring stop 61 comes into mechanical contact during a movement of at least one portion of seismic mass 3 in third direction 13 beyond an operating range; thereafter, second spring stop 62 comes into mechanical contact during a further movement of at least one portion of seismic mass 3 in third direction 13; and thereafter, fixed stop 63 comes into mechanical contact during a further movement of at least one portion of seismic mass 3 in third direction 13.

At an overload of micromechanical structure 1, due to which the operating range is exited, first spring stop 61 may initially impact. Energy is then stored in first spring stop 61, which may subsequently be given off again to seismic mass 3. If micromechanical structure 1 is further loaded, second spring stop 62 may impact. It may be provided that first spring stop 61 is further compressed, so that energy is now also stored in first spring stop 61 as well as in second spring stop 62, which may be subsequently given off again to seismic mass 3.

First spring stop 61, second spring stop 62, and fixed stop 63 are situated between seismic mass 3 and substrate 2.

In one exemplary embodiment, first spring stop 61 includes a first stop spring 71 and second spring stop 62 includes a second stop spring 72. A first spring stiffness of first stop spring 71 is less than a second spring stiffness of second stop spring 72 and the first spring stiffness is greater than a third spring stiffness of main spring 5, i.e., torsion spring 51. First stop spring 71 and the second stop spring 72 are situated in the portion of first spring stop 61 and second spring stop 62, respectively, mounted at seismic mass 3.

In one exemplary embodiment, as shown in FIGS. 1 through 3, main spring 5 includes a torsion spring 51, detection means 4 being provided for detecting a rotary deflection of seismic mass 3 about a rotation axis 14, rotation axis 14 being situated in second direction 12.

In one exemplary embodiment, as shown in FIGS. 1 through 3, fixed stop 63 has a greater distance to torsion spring 51 than second spring stop 62 with respect to first direction 11. Moreover, first spring stop 61 has a greater distance to torsion spring 51 than second spring stop 62 with respect to first direction 11. In third direction 13, a vertical distance of fixed stop 63 is greater than the vertical distances of fixed stops 61, 62.

Moreover, a first functional layer 81, a second functional layer 82, and a third functional layer 83 are shown in FIGS. 2 and 3, substrate 2 being situated in first functional layer 81 and seismic mass 3, together with torsion spring 51, being situated in third functional layer 83. Detection means 4 and graduated stop structure 6 are situated completely in second functional layer 82 in this exemplary embodiment.

FIG. 4 shows a cross section of an alternative embodiment of seismic mass 1, which corresponds to seismic mass 1 from FIGS. 1 through 3, provided that no differences are described in the following. A top view of this micromechanical structure 1 would correspond to FIG. 1. The cross section is guided through section line designated as AA'. First stop spring 71 is situated in the portion of first spring stop 61 mounted at the substrate.

FIG. 5 shows a cross section of the alternative embodiment of seismic mass 1 from FIG. 4 at the section line designated as BB'. Second stop spring 72 is situated in the portion of second spring stop 62 mounted at the substrate.

Alternatively, one of spring stops 61, 62 may also include a stop spring 71, 72 situated at substrate 2 and one of spring stops 61, 62 may include a stop spring 71, 72 mounted at seismic mass 3.

In FIGS. 2 through 5, two first spring stops 61 and two second spring stops 62 are shown in each case, first spring stops 61 being situated on various sides of torsion spring 51 and second spring stops 62 also being situated on various sides of torsion spring 51. This means that a first spring stop 61 is situated at first sub-mass 31 and a first spring stop 61 is situated at second sub-mass 32, and a second spring stop 62 is situated at first sub-mass 31 and a second spring stop 62 is situated at second sub-mass 32. Only one first spring stop 61 and only one second spring stop 62 may also be provided in each case. Fixed stop 63 is situated only on one side of torsion spring 51, at first sub-mass 31 in each case. Alternatively or additionally, it may also be provided to situate a fixed stop 63 at second sub-mass 32.

FIG. 6 shows a view of a seismic mass 3 of a micromechanical structure 1 from below, i.e., as viewed from substrate 2. In this exemplary embodiment, stop springs 71, 72 are situated within seismic mass 3. Micromechanical structure 1 from FIG. 6 corresponds to above-described micromechanical structures 1, provided that no differences are described in the following.

FIG. 7 shows a cross section of micromechanical structure 1 from FIG. 6 at the section line designated as CC'. First stop springs 71 of first spring elements 61 are situated within third functional layer 83 in a first recess 33 of seismic mass 3 in each case. A first projection 64 of first spring stop 61 projects over the seismic mass.

Figure 8:
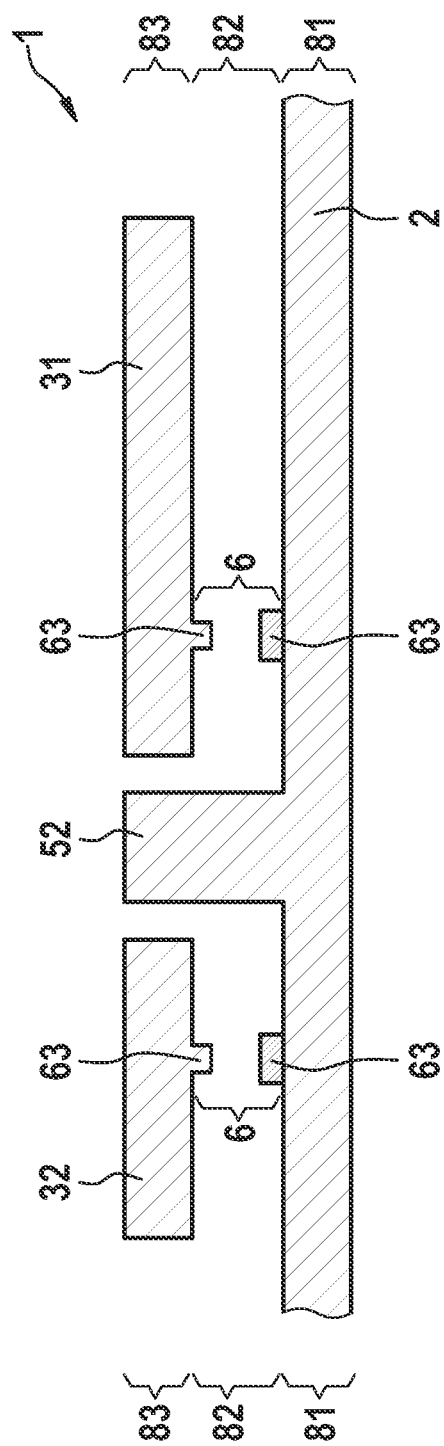
FIG. 8 shows a further cross section of the micromechanical structure from FIG. 6.

FIG. 8 shows a cross section of micromechanical structure 1 from FIG. 6 at the section line designated as DD'. Fixed stop 63 is situated between seismic mass 3 and substrate 2.

Figure 9:
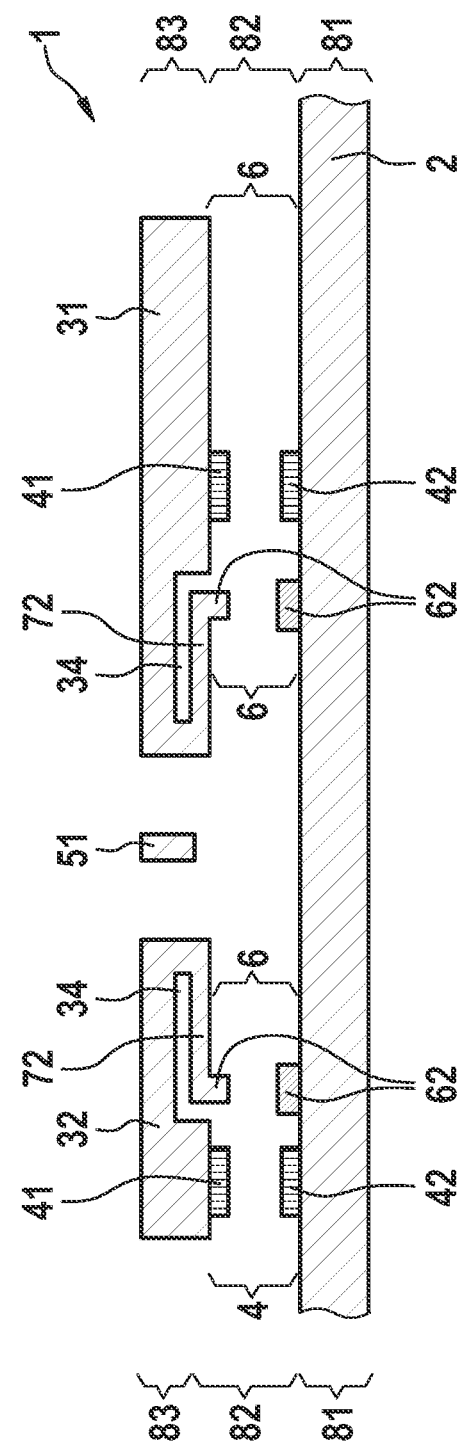
FIG. 9 shows a further cross section of the micromechanical structure from FIG. 6.

FIG. 9 shows a cross section of micromechanical structure 1 from FIG. 6 at the section line designated as EE'. Second stop springs 72 of second spring elements 62 are situated within third functional layer 83 in a second recess 34 of seismic mass 3 in each case. A second projection 65 of second spring stop 62 projects over the seismic mass.

In the exemplary embodiment from FIGS. 6 through 9, fixed stop 63 has a smaller distance to torsion spring 51 than second spring stop 62 with respect to first direction 11. Moreover, second spring stop 62 has a smaller distance to torsion spring 51 than first spring stop 61 with respect to first direction 11. Moreover, spring stops 61, 62 and fixed stop 63 are designed in such a way that the stops, in a rest position, have an identical base distance in each case. Due to this embodiment, it may be achieved that first spring stop 61 initially comes into mechanical contact during a movement of first sub-mass 31 or of second sub-mass 32 toward substrate 2, i.e., in third direction 13, beyond an operating range; thereafter, the second spring stop 62 comes into mechanical contact during a further movement; and thereafter, fixed stop 63 comes into mechanical contact during a further movement.

FIG. 10 shows a top view of a micromechanical structure 1, which also includes a substrate 2, a seismic mass 3, and main springs 5. Seismic mass 3 is connected to substrate 2 with the aid of main springs 5 via an anchoring area 52. A first direction 11 and a second direction 12 essentially perpendicular to first direction 11 define a main extension plane of substrate 2.

FIG. 11 shows a cross section of micromechanical structure 1 from FIG. 10. Detection means 4 for detecting a deflection of seismic mass 3 are not represented, although they may be situated as described above. Micromechanical structure 1 has a graduated stop structure 6 including a first spring stop 61, a second spring stop 62, and a fixed stop 63. Stop structure 6 is designed in such a way that first spring stop 61 initially comes into mechanical contact during a movement of seismic mass 3 in a third direction 13, which is perpendicular to first direction 11 and to second direction 13, beyond an operating range. Thereafter, second spring stop 62 comes into mechanical contact during a further movement of seismic mass 3 in third direction 13. Thereafter, fixed stop 63 comes into mechanical contact during a further movement of seismic mass 3 in third direction 13.

In contrast to the embodiments from FIGS. 1 through 9, the measuring principle of micromechanical structure 1 from FIGS. 10 and 11 is therefore based on a complete deflection of seismic mass 3 in third direction 13 and not on a rotation of seismic mass 3 about rotation axis 14. Moreover, it may be provided in this exemplary embodiment, as represented in FIG. 11, that fixed stop 63 has a greater base distance than second spring stop 62 with respect to third direction 13 and second spring stop 62 has a greater base distance than first spring stop 61 with respect to third direction 13. As a result, initially first spring stop 61, then second spring stop 62, and then fixed stop 63 come into mechanical contact during a movement of seismic mass 3 in third direction 13 beyond the operating range.

FIG. 12 shows a micromechanical sensor 9 including one of the described micromechanical structures 1 and an optional control chip 91 for evaluating the measuring signals of the detection means.

Although the present invention was described with reference to the preferred exemplary embodiments, the present invention is not limited to the described examples and other variations therefore may be derived by those skilled in the art without departing from the scope of protection of the present invention.

What is claimed is:

1. A micromechanical structure, comprising:
a substrate;
a seismic mass movable with respect to the substrate;
a detection structure; and
a main spring, the seismic mass being connected to the substrate using the main spring;
wherein a first direction and a second direction perpendicular to the first direction defining a main extension plane of the substrate;
wherein the detection structure is configured to detect a deflection of the seismic mass, the detection structure including an electrode structure, the electrode structure including first electrodes mounted at the seismic mass and second electrodes mounted at the substrate, the first electrodes and the second electrodes having a two-dimensional extension in the first direction and in the second direction;
wherein the micromechanical structure has a graduated stop structure including a first spring stop, a second spring stop, and a fixed stop, the stop structure being configured in such a way that initially the first spring stop comes into mechanical contact with the substrate during a movement of at least one portion of the seismic mass in a third direction, which is perpendicular to the first direction and to the second direction, beyond an operating range, thereafter, the second spring stop comes into mechanical contact with the substrate during a further movement of at least one portion of the seismic mass in the third direction, and, thereafter, the fixed stop comes into mechanical contact with the substrate during a further movement of at least one portion of the seismic mass in the third direction,
wherein the first spring stop and the second spring stop are situated one behind the other in the second direction,
wherein the main spring includes a torsion spring, and wherein the detection structure is configured to detect a rotary deflection of the seismic mass about a rotation axis, the rotation axis being situated in the second direction,
wherein the fixed stop has a greater distance to the torsion spring than the first spring stop with respect to the first direction and the first spring stop has a greater distance to the torsion spring than the second spring stop with respect to the first direction.

2. The micromechanical structure as recited in claim 1, wherein the micromechanical structure includes multiple functional layers, the first spring stop and the second spring stop being at least partially situated in the same functional layer of the functional layers.

3. The micromechanical structure as recited in claim 1, wherein the first spring stop includes a first stop spring and the second spring stop includes a second stop spring, a first spring stiffness of the first stop spring being less than a second spring stiffness of the second stop spring, and the first spring stiffness being greater than a third spring stiffness of the main spring.

4. The micromechanical structure as recited in claim 1, wherein the first spring stop and the second spring stop are at least partially situated within the seismic mass.

5. The micromechanical structure as recited in claim 1, wherein the first spring stop, the second spring stop, and the fixed stop are situated between the substrate and the seismic mass.

6. The micromechanical structure as recited in claim 1, wherein the seismic mass may be completely deflected in the third direction during an acceleration acting in the third direction, and the detection structure is configured to detect the deflection in the third direction.

7. The micromechanical structure as recited in claim 6, wherein the fixed stop has a greater base distance than the second spring stop with respect to the third direction and the second spring stop has a greater base distance than the first spring stop with respect to the third direction.

8. A micromechanical sensor, comprising:
a micromechanical structure, including:
a substrate,
a seismic mass movable with respect to the substrate,
a detection structure, and
a main spring, the seismic mass being connected to the substrate using the main spring,
wherein a first direction and a second direction perpendicular to the first direction defining a main extension plane of the substrate,
wherein the detection structure is configured to detect a deflection of the seismic mass, the detection structure including an electrode structure, the electrode structure including first electrodes mounted at the seismic mass and second electrodes mounted at the substrate, the first electrodes and the second electrodes having a two-dimensional extension in the first direction and in the second direction,
wherein the micromechanical structure has a graduated stop structure including a first spring stop, a second spring stop, and a fixed stop, the stop structure being configured in such a way that initially the first spring stop comes into mechanical contact with the substrate during a movement of at least one portion of the seismic mass in a third direction, which is perpendicular to the first direction and to the second direction, beyond an operating range, thereafter, the second spring stop comes into mechanical contact with the substrate during a further movement of at least one portion of the seismic mass in the third direction, and, thereafter, the fixed stop comes into mechanical contact with the substrate during a further movement of at least one portion of the seismic mass in the third direction,
wherein the first spring stop and the second spring stop are situated one behind the other in the second direction,
wherein the main spring includes a torsion spring, and wherein the detection structure is configured to detect a rotary deflection of the seismic mass about a rotation axis, the rotation axis being situated in the second direction,
wherein the fixed stop has a greater distance to the torsion spring than the first spring stop with respect to the first direction and the first spring stop has a greater distance to the torsion spring than the second spring stop with respect to the first direction.

\* \* \* \* \*